United States Patent [19]

Hardee et al.

[11] Patent Number: 4,680,762
[45] Date of Patent: Jul. 14, 1987

[54] METHOD AND APPARATUS FOR LOCATING SOFT CELLS IN A RAM

[75] Inventors: Kim C. Hardee, Clermont, Fla.; Anwar U. Khan, Santa Clara, Calif.; Steven D. McEuen; David J. Wicker, Jr., both of Colorado Springs, Colo.

[73] Assignee: Inmos Corporation, Colorado Springs, Del.

[21] Appl. No.: 788,443

[22] Filed: Oct. 17, 1985

[51] Int. Cl.[4] .......................................... G01R 31/28
[52] U.S. Cl. ...................................... 371/28; 365/201; 371/21
[58] Field of Search ................... 371/28, 21; 365/201; 324/73 R

[56] References Cited

U.S. PATENT DOCUMENTS

| | | | |
|---|---|---|---|
| 3,478,286 | 11/1969 | Dervan III | 371/28 X |
| 3,655,959 | 4/1972 | Chernow et al. | 371/28 X |
| 4,335,457 | 6/1982 | Early | 371/28 |
| 4,418,403 | 11/1983 | O'Toole et al. | 365/201 |
| 4,481,628 | 11/1984 | Pasquinelli | 371/28 |
| 4,527,254 | 7/1985 | Ryan et al. | 365/201 X |
| 4,553,225 | 11/1985 | Che | 365/201 |

OTHER PUBLICATIONS

Marrotte, Tape Phase Error-Detection Measurement, IBM Technical Disclosure Bulletin, vol. 11, No. 10, Mar. 1969, p. 1210.

Primary Examiner—Charles E. Atkinson
Attorney, Agent, or Firm—Edward D. Manzo; Roger R. Wise

[57] ABSTRACT

To locate soft cells in a memory cell array, a known logic pattern is written in the memory array. The word lines for the array are then sequentially subjected to a nonstandard test signal such as a slowly varying voltage. Word lines are returned to VCC and the array is then interrogated to identify memory cells which have flipped logic states. These cells are identified as soft or potentially defective cells. The process can be repeated with the logically opposite logic pattern being initially stored in the array. Apparatus is provided for implementing this process on a standard RAM memory cell array. An access pad is added for receipt of an externally generated test signal. A control circuit selectively couples the test signal to the word lines for the memory array.

19 Claims, 5 Drawing Figures

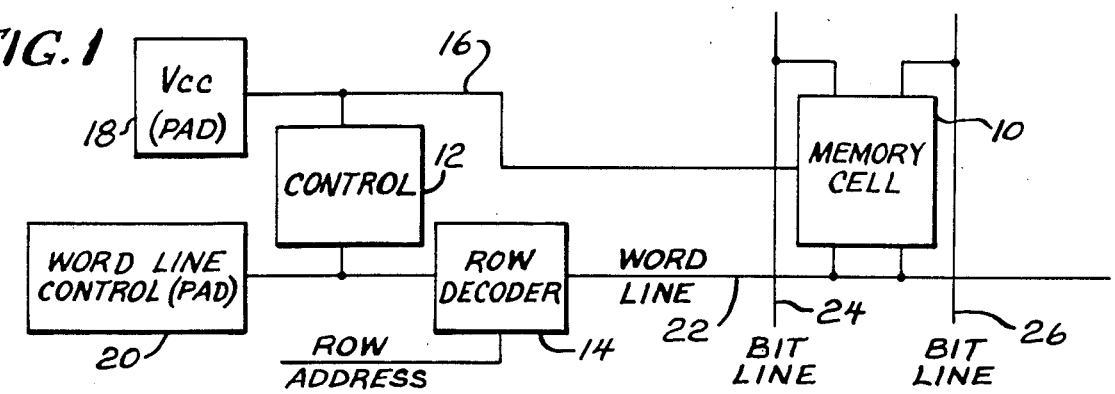
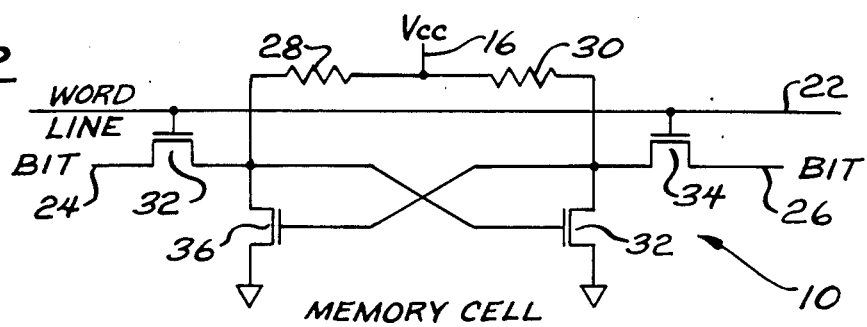
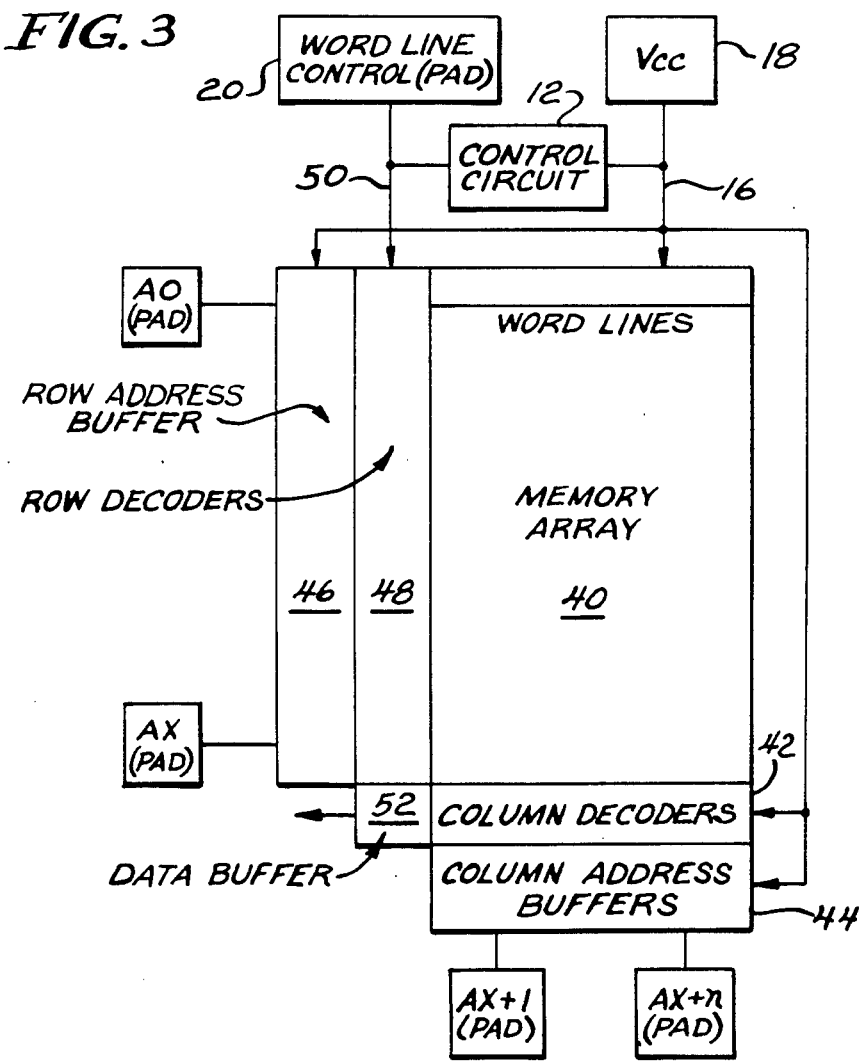

METHOD AND APPARATUS FOR LOCATING SOFT CELLS IN A RAM

BACKGROUND OF THE INVENTION

The present invention relates to testing memory cell arrays to locate soft (potentially defective) cells. The present invention provides a method for testing memory cell arrays to locate soft cells and provides an apparatus for implementing the test.

Memory cell arrays as used in semiconductor RAMS are fabricated using increasingly small geometries. During fabrication, cells may be produced in the array which are shorted or opened because of flaws in the structure or defects in the fabrication process. These cells may be readily detected and located in post-fabrication testing because of their characteristics which are quite distinct and readily identifiable compared to the desired cell characteristics, i.e., these cells never store information as desired.

More problematical are other cells in the array which, although not shorted or opened, will not possess the desired cell characterisitics. For example, these cells may have imbalanced threshold voltages between a pair of transistors in the cell. Defects such as these do not necessarily result in cell failure, although they are potentially defective (soft) and would probably result in failure at some time during use. However, such cells are not easily detected or located during standard testing. Because the exact weakness or defect in the cell is not easily defined and may in fact range widely, there is no established test for locating these defective cells. As a consequence, many arrays may be approved for sale and use while actually containing defective cells. No good test apparatus or method for locating such soft cells has come to light despite the persistence of this problem for several years.

Therefore, it is desirable to devise a method for testing memory cell arrays to detect and locate cells which are soft (potentially defective) before the memory is sold. Similarly, it is desirable to provide circuitry for implementing this testing without affecting the performance of the memory cell array and without unduly increasing the cost of the final cell array.

Accordingly, it is a principal object of the present invention to provide a method for locating soft cells in a memory cell array.

It is a related object of the present invention to provide apparatus for implementing such testing for individual memory cell arrays.

Further objects are to provide method and apparatus which are easy to operate and which adapt to standard test equipment.

SUMMARY OF THE INVENTION

The present invention provides a method and apparatus for locating soft cells in a memory cell array, such as a RAM. The invention makes use of the discovered phenomenon that soft cells will flip (change state) if a nonstandard voltage or varying voltage is applied in some manner to the cell when it is otherwise connected for operation.

In the preferred embodiment of the invented method, the nonstandard voltage (test signal) is applied during a test to the word line after a known logic value is stored in a memory cell within an array. In one embodiment, the nonstandard voltage varies in amplifude. This signal will preferably vary slowly over an amplitude range of from about ground to about $V_{cc}$, the chip supply voltage. After the test signal is applied to the word line for the cell, the cell is read to determine if the same logic value is still stored or the cell has flipped logic states. The testing may be adapted to an entire memory array by applying a selected sawtooth voltage signal to a row decoder and then sequentially addressing each row in the array through the row decoder in time with the period of the sawtooth. Also, the process may be repeated using logic value opposite to that which was originally stored. Any cell which "flips" or changes logic state in response to the applied test signal is identified as a soft cell.

The preferred embodiment of the invented apparatus generally provides access to the word line during testing. Normally, the $V_{cc}$ pad of the memory device is coupled electrically to row decoders and other memory circuits. In the preferred embodiment, $V_{cc}$ is still coupled to most of the memory during probe testing, but the voltage applied to the cell to be tested is manipulated via the word line. Preferably an additional pad, accessible preferably only prior to packaging, permits a probe tester to be connected to this further pad and to couple any signal there to the word lines for the cells. Means such as control circuitry is included preferably on the chip to selectively couple the additional pad to the word line and to isolate the additional pad from the word lines during normal operation or other testing. The control circuitry may be fabricated in several embodiments and may comprise a two-state, selective switch which ties the additional pad to the chip supply line during normal operation ad effectively breaks that connection in response to predetermined stimuli to allow the test signal to be applied to the word lines without excessive current draw. Other pads normally present on the chip itself, such as the substrate voltage bias pad or the chip select pad, may be used to apply the stimuli to trigger the control circuitry to disconnect the additional pad from the chip supply line. Alternatively, the method by which the chip is "powered up" may determine the state of the control circuitry. Also, the additional pad may be permanently, electrically disabled after testing to maintain the additional pad in permanent connection with the chip supply line.

BRIEF DESCRIPTION OF THE DRAWINGS

Various features of the present invention are set forth in the appended claims. The invention, together with its objects and advantages thereof, may be best understood by reference to the following detailed description taken in conjunction with the accompanying drawings in which like elements are generally indicated with like reference numerals and of which:

FIG. 1 is a sketch illustrating invented apparatus which can use the invented method for testing the memory cell illustrated in FIG. 2;

FIG. 2 is a schematic diagram of one possible memory cell which may be tested according to the process of the present invention;

FIG. 3 is a block diagram representation of a memory cell array arranged in accordance with the preferred embodiment of the present invention for testing according to the process of the present invention;

DETAILED DESCRIPTION OF THE PREFERRED EMBODIMENT

Figure 4:
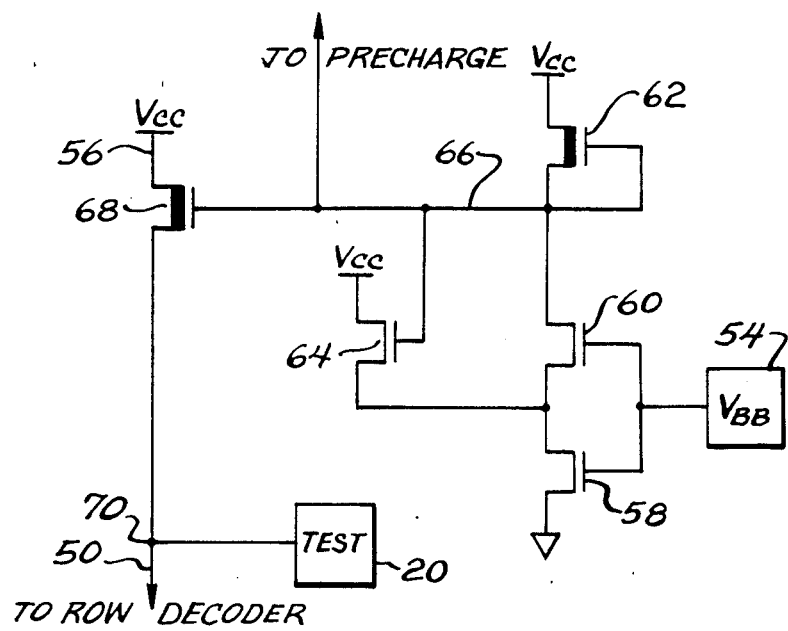
FIG. 4 is a schematic diagram of one embodiment of the control circuitry of FIG. 3.

The present invention generally provides a method and an apparatus for locating soft cells in a memory cell array. A method is provided which readily identifies soft cells by their undesired characteristic of changing logic states. Apparatus is provided which implements the invented test method. Control circuitry effectively allows an outside signal to be applied to the word lines for each cell in the memory cell array.

The process of the present invention generally involves storing a known value in a memory cell, applying a nonstandard signal to the cell, and then reading the memory cell to see if the same information is still stored. Specifically, during probe testing, a logic "1" or "0" may be stored in a memory cell such as memory cell 10 in FIG. 1, which illustrates one representative apparatus for implementing the invented method. During testing, the memory is connected first for normal operation or can be connected for test operation with the word line voltage set for normal operation. The memory is then loaded uniformly with all one bits or all zero bits. Next, test signals are applied to the cells via the word lines, for example. Once the known value is stored in memory cell 10, a control unit 12 disconnects a row decoder 14 from the power supply line 16 which is connected to the standard $V_{cc}$ pad 18. At this time, a test signal is applied to the word line by means of a probe tester to a word line control pad 20. This provides the test signal, preferably varying over time, through row decoder 14 to word line 22 for memory cell 10. After the test signal has been applied from pad 20 to word line 22 for memory cell 10, the probe tester may permit $V_{cc}$ to be coupled to the row decoder, as in ordinary non-test conditions. Then cell 10 is read by means of bit lines 24 and 26 to determine whether the originally stored datum is still present in the memory cell or whether memory cell 10 has flipped logic states. If cell 10 has changed logic states, it is identified as a "soft" cell and may be located conventionally through identification of the appropriate word line 22 and bit line 24.

Due to the nature of the defects which are likely to be detected by the process of the present invention, it is appropriate to repeat the process with the opposite logic value being initially stored in memory cell 10. For example, if a "1" was stored originally, a logic "0" would next be stored, and vice versa. Once again, control unit 12 passes control of word line 22 to the pad 20 and a varying signal is applied to word line 22. After the completion of the varying signal, memory cell 10 is again interrogated to determine whether it still contains the logic value which was most recently stored in it—in this case a "0." If the logic state of memory cell 10 has flipped, memory cell 10 is identified as a "soft" cell. By repeating the process in this fashion, potentially defective cells may be identified when they would otherwise have gone undetected. A cell need only flip from a "1" to a "0" or from a "0" to a "1" in order to be identified as a soft cell.

FIG. 2 illustrates a four transistor memory cell which may be tested using the invented process. Specifically, memory cell 10 is a typical RAM memory cell having a word line 22, bit lines 24 and 26, resistors 28 and 30, a pair of transfer transistors 32 and 34, and a pair of driver transistors 36 and 38.

During fabrication, cell 10 may experience many defects. For example, resistors 28 or 30 could short the transistors directly to $V_{cc}$ line 16. Or, bit lines 24 or 26 may be shorted to word line 22. Such defects are readily identifiable using standard testing procedures. However, it is the more subtle defects with which the present invention is concerned. For example, transistors 36 and 38 may be imbalanced by having unequal threshold voltages. If transistor 38 has a threshold voltage significantly lower than that of transistor 36, the information stored in cell 10 may "flip" logic states at inappropriate times. That is, when a "0" should be present on bit line 24, a "1" will appear. Such defects may not be detected during standard testing procedures, and it is such defects that the preferred embodiment of the present invention does locate by providing varying voltage stimuli on word line 22 to trigger memory cell 10 if it is a soft cell—to "flip" states. If memory cell 10 is not defective, it will not flip states, regardless of the voltages applied to word line 22.

The invented method is efficiently used in testing entire arrays rather than merely a single cell as illustrated in FIG. 1. FIG. 3 illustrates a memory cell array 40 containing representative apparatus according to this invention. A standard 16K Static RAM will typically include fourteen address pads and one respective pad for each of the following: $V_{cc}$, $V_{ss}$, chip enable, write enable, data in, and data out. The memory of FIG. 3 contains further circuitry. In particular, it further includes a test pad 20 (for coupling to a probe tester to achieve word line control) and a control circuit 12. During normal operation, line 16 coupled to $V_{cc}$ pad 18 receives the chip supply voltage, which is supplied to memory array 40, column decoder 42, column address buffers 44, row address buffers 46 and row decoders 48. As shown in FIG. 3, $V_{cc}$ is supplied to row decoders 48 through (or by permission of) control circuit 12 via line 50. Also shown in the typical memory array of FIG. 3 are row address pads A(0) through A(X), column address pads A(X+1) through A(X+n), and data buffer 52.

Memory array 40 may be tested by applying a test signal to the row decoders 48. This is accomplished preferably although not necessarily through the use of control circuit 12, several embodiments of which are described below. Once control of line 50 to decoders 48 has been transferred to pad 20, the cells of memory array 40 may receive the test signal and later be interrogated in a fashion similar to that explained above in connection with FIG. 1. Specifically, a predetermined logic pattern is stored in the entire memory array 40. For example, "1's" may be written in each cell in memory array 40 with the voltage at line 50 being $V_{cc}$, supplied by either pad 20 or pad 18. Then, a varying voltage signal is supplied to row decoder 48 via line 50 from pad 20. After the varying voltage test signal has been supplied to each of the word lines in memory array 40, the voltage on line 50 is returned to $V_{cc}$, either via pad 18 or 20. At that time, the entire memory array 40 is read to determine whether any of the cells therein have flipped logic states. Those cells which have flipped states are identified as soft cells and located by their word and bit addresses.

To locate additional cells which may have not been identified in the first application of the present process, the opposite logic pattern is stored in the memory array. For example, "0's" may be stored in each cell in memory array 40. The test routine is then repeated.

The varying voltage signal or stimuli applied via line 50 from pad 20 to row decoders 48 may be any one of a number of signals. One of the features of this invention is to control a voltage at the cell to be non-standard during the test. Usually the voltage at the word line is either zero or $V_{cc}$. Thus, the test signal may be some other voltage applied to the word line, whether within or without the limits defined by 0 and $V_{cc}$. The test signal may be a constant voltage or a varying voltage (discretely or continuously variable) within or without the range. In a preferred embodiment, the test signal is a ramped voltage, specifically a sawtooth waveform applied to pad 20. In this embodiment, the voltage is allowed to vary from about ground, 0 volts, to about $V_{cc}$, approximately 5 or 6 volts. In this waveform, the voltage ramps up slowly and then ramps down even more slowly to provide a wide range of voltages to each word line. Preferably at least one entire sawtooth period is applied to each word line in memory array 40. This is easily achieved with a probe tester. When this is done, each word line, and correspondingly each memory cell on that word line, is subjected to a slowly increasing voltage and then a slowly decreasing voltage. In this fashion, cells which have a tendency to flip in response to decreasing voltages and those having a tendency to flip in response to increasing voltages may be located.

In the preferred embodiment of the present invention, the rise time of the voltage sawtooth wave form may be approximately 500 microseconds. The fall time for this same voltage waveform may be in the neighborhood of 1000 microseconds. These rise and fall times are given by way of illustrations of the fact that the ramping of the sawtooth is desired to be relatively slow compared to the logic switching times for the transistors typically used in a memory cell such as transistors 32 through 38 of memory cell 10 in FIG. 2. A typical field effect transistor used in a cell such as that illustrated in FIG. 2 may have a logic switching speed of approximately 1 nanosecond. Thus, in a preferred embodiment of the present invention, the rise and fall times for the voltage sawtooth applied to the word lines of array 40 will be in the neighborhood of 500–1000 times slower than the switching speeds of the typical transistors used in the cells of array 40. In this fashion, the transistors in the cells of array 40 may respond to the varying voltages of the signal from pad 20 because each cell "sees" every voltage in the sawtooth ramp for a time far in excess of that required for its own internal switching.

Preferably at least one period of the sawtooth voltage waveform applied to pad 20 is applied to each word line in memory array 40. This may be effectuated by sequentially addressing the word lines of array 20 through the operation of row address buffers 46 and row decoders 48. Thus, if each word line in array 40 is addressed for a time period corresponding to the period of the waveform applied to pad 20, it will be subjected to each varying voltage as the signal ramps up and then back down as described above. Also, each word line in array 40 may be subjected to multiple periods of the sawtooth voltage applied to pad 20 by simply addressing each word line for an integral multiple of the period of the signal at pad 20.

During this test, the memory is coupled to standard operating voltages, with the exception of the word lines. This exception preferably is achievable only prior to packaging the memory. Thus, normal voltages are applied to the $V_{cc}$, $V_{ss}$, and other pads. Also, it has been found that the back bias ($V_{bb}$) level can be raised (to between $-3_v$ and $0_v$) to heighten the propensity of soft cells to flip their states during this test.

Also, during the probe testing, we have found that by controlling both bit lines to be at $V_{cc}$, soft cells are more prone to fail. Thus, a further step which may be performed is to control the bit line pairs of the memory to go to $V_{cc}$ during testing.

FIG. 4 schematically shows one embodiment of the control circuit 12 of FIG. 3. This embodiment uses N channel depletion mode field effect transistors ("FETs") and N channel enhancement mode FETs. In the drawings, enhancement type n-channel transistors are 58, 60, etc. whereas depletion type transistors are 62 and 68. In this embodiment, a pad 54 is used to determine whether the voltage on line 50 will be applied via pad 20 or via line 56 which is coupled always to $V_{cc}$. Pad 54 may be the $V_{bb}$ pad (as illustrated) which during normal operation would be connected to the substrate and would typically have a bias of approximately $-3$ V. However, prior to packaging, this pad 54 may be available on the memory chip without a preset bias, and the back of the chip substrate can be connected to a $V_{bb}$ voltage even though pad 54 may be used for other purposes.

For testing, a known or predetermined logic pattern will be stored in memory array 40. At that time, approximately a five volt potential will be applied to pad 54. With a positive potential applied to pad 54, transistors 58, 60, 62, and 64 act as a Schmidt trigger to bring the potential on line 66 to approximately ground. When a ground potential is present on line 66 at the gate electrode of transistor 68, transistor 68 turns off. When transistor 68 is off, it exhibits a very high resistance between source and drain thus allowing for a significant voltage drop between line 56 and node 70. This in turn allows the signal supplied to the row decoder on line 50 to be controlled by whatever signal is applied to pad 20, in this case a test signal, without requiring excessive current. In this fashion, a $V_{cc}$ voltage may be applied for writing data in the cells or a varying voltage test signal such as described above may be applied to each word line in array 40 to attempt to flip any soft cells therein.

After each word line has been subjected to the varying voltage signal, it is desirable to return the array to a condition for reading to determine which of the cells in the array flipped logic states. This is accomplished in the embodiment of FIG. 4 simply by raising the probe tester voltage at pad 20 to $V_{cc}$ or, alternatively, by applying a low potential such as negative three volts to pad 54. Again, transistors 58, 60, 62, and 64 act as a Schmidt trigger to drive the potential on line 66 high in response to the low potential on pad 54. A high potential on line 66 at the gate of transistor 68 turns transistor 68 on. In its on condition, it exhibits a relatively low resistance between source and drain and effectively couples the $V_{cc}$ voltage present on line 56 to node 70, thus effectively shunting the voltage waveform signal supplied to pad 20. In these manners, the array may be read without interference from a signal present on pad 20.

During subsequent operations, any signal which may be present at pad 20 is prevented from being supplied to the word lines of the array. The control circuit of FIG. 4 prevents this through the coupling of pad 54 to the bottom of the wafer after the testing is completed. In normal operation, the substrate is biased to approximately negative three volts. Thus, a low potential will always be present at pad 54 which through the operation of transistors 58, 60, 62, and 64 will maintain a high potential at 66 at the gate to transistor 68. This will maintain transistor 68 in its "on" condition to keep the $V_{cc}$ voltage of line 56 coupled to node 70 thereby shunting pad 20 during normal operation.

Figure 5:
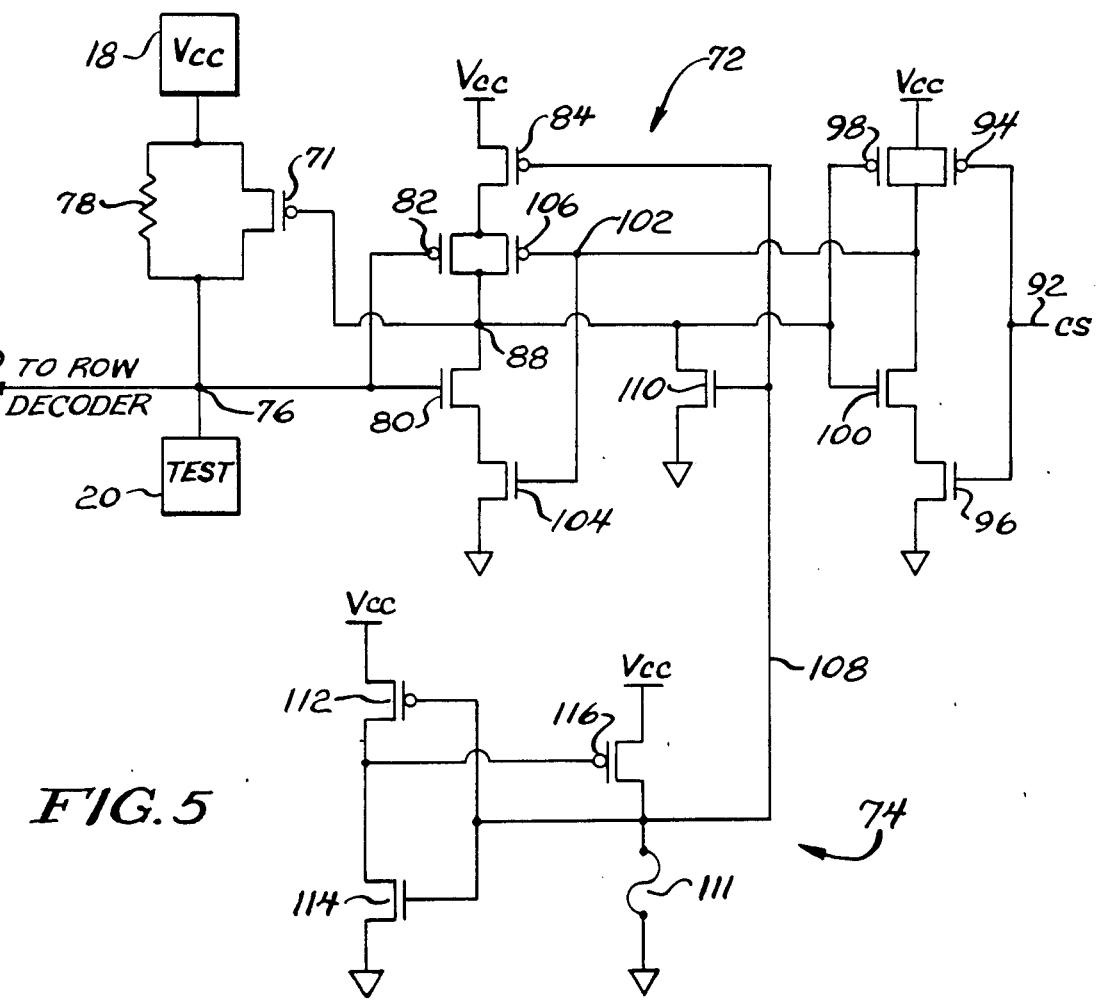
FIG. 5 is a schematic diagram of an alternate embodiment of the control circuitry for a CMOS static RAM.

A second embodiment of a control circuit of the type contemplated in FIG. 3 is illustrated schematically in FIG. 5. It will be noted that there are no depletion type FETs used here. Indeed this embodiment is for a control circuit for a CMOS static RAM, and no $V_{bb}$ pad is required for this implementation, nor is the $V_{bb}$ chip potential employed in this control circuit. Instead, a latch is used in combination with a test signal pad and a $V_{cc}$ pad, and the chip select (CS) signal is employed. The latch operates at selected times to cut off the conductive path between the $V_{cc}$ pad and the test pad.

By way of overview, a $V_{cc}$ pad 18 and a test pad 20 are coupled by a resistor 78 which is about 1000 ohms and the source-drain path of a p-channel FET 71. Line 50 to the row decoders is coupled to this circuit portion on the test pad side of transistor 71. Transistor 71 is gated by a latch 72 which basically is a flip-flop circuit. To set the latch to the test state, simply connect the circuit to a probe tester and power up $V_{cc}$ with test pad 20 being at some lower voltage such as ground. As will be explained infra, the latch 72 will force the gate of transistor 71 to $V_{cc}$ which turns off that transistor. Now the probe tester can apply any voltage to test pad 20, even ground potential, with little current passing through resistor 78. This mode of operation is preferable to simply forcing pad 20 to ground, or some other test voltage, without first turning off FET 71 (although this could be done). With FET 71 off and the probe tester connected, bring the voltage at pad 20 to $V_{cc}$, the standard voltage level for the supply to the row decoders, and write data into memory array 40 (FIG. 3). Next, apply the nonstandard signal to test pad 20, such as a sawtooth signal ramping from ground to $V_{cc}$ slowly and then back to ground for one or more cycles. Eventually bring the voltage applied to test pad 20 back to $V_{cc}$ with the probe tester and read the data to check for flipped states indicative of soft memory cells. The latch 72 can then be disabled to leave transistor 71 on for other test operations. A fuse latch 74 also provided in the embodiment of FIG. 5 may be used to latch pad 18 permanently to line 50 to prevent any signals present at pad 20 from interfering with the operation of the array during normal operations.

Turning now the specific details of this embodiment, latch 72 is coupled to transistor 71, fuse circuit 74 and a node 76 which is between pads 18 and 20 and is coupled to line 50. Latch 72 comprises transistors 80, 82, 84, 94, 96, 98, 100, 104, 106 and 110. As mentioned, it is preferred to hold pad 20 to ground as the chip is powered up, that is, as pad 18 is ramped up to approximately five volts. Therefore, node 76 which is coupled to pad 20 will also be at ground potential, and there will be a voltage drop across resistor 78 corresponding to approximately $V_{cc}$. Because node 76 is low, transistor 80 will be turned off and transistor 82 (P-channel FET) will be turned on. Because transistor 84 will also be on (through the action of fuse latch 74 as explained below), a node 88 will have a high potential which will keep transistor 71 turned off. Similarly, during this time period the chip select (CS) signal present on a line 92 will typically be high which means that transistor 94 will be turned off and transistor 96 will be turned on. Also, because node 88 is high, transistor 98 will be turned off and transistor 100 will be turned on. The result of these conditions is that a node 102 will be low which keeps transistor 104 off and transistor 106 turned on. Thus, through the path provided by transistors 84 and 106, node 88 will remain high and transistor 71 off regardless of the voltage which may be developed at node 76.

Therefore, once the chip has been powered up, the voltage at pad 20 may be switched to $V_{cc}$ and a logic pattern read into the memory array. A test signal such as a varying voltage waveform may then be applied at pad 20 to supply a varying voltage or other test signal to each of the word lines accessed via line 50. After each word line has been subjected to an entire cycle of the voltage waveform supplied at pad 20, pad 20 may be returned to the $V_{cc}$ potential, and the cells in the memory array may be read to determine whether they have flipped, which would indicate that they are soft cells. Further, an additional but complementary logic pattern may then be read into the cells which can then again be subjected to testing to determine which of the cells in the array are soft.

Once the test has been successfully completed, latch 72 can be reset to return the control of node 76 and, correspondingly, line 50 to the $V_{cc}$ potential at pad 18. Latch 72 can be reset at least two ways: (1) by powering down and letting the circuit power up normally (without holding test pad 20 at ground); or (2) by dropping the chip select signal CS (right side of FIG. 5) to ground. Thus, after the final reading of the cells in the array to determine whether they have flipped, the potential at node 76 will typically be high. Because of this, transistor 82 will be off and transistor 80 will be on. At this time, a low CS voltage on line 92 turns transistor 94 on and transistor 96 off, which releases node 102 from ground and allows it to rise to the high potential of about $V_{cc}$. When node 102 goes high, transistor 106 turns off and transistor 104 turns on. As previously mentioned, at this time transistor 80 is likewise on and transistor 82 is likewise off. Thus, a path to ground is established for node 88, and it therefore falls to ground potential. Because node 88 has dropped to ground potential, transistor 71 turns on. This creates a low resistance path from pad 18 to node 76. Thus, any signal supplied at pad 20 is effectively shunted unless a high current is supplied. In this fashion, the control of node 76, and the corresponding line 50 to the row decoder, has been returned to the $V_{cc}$ pad 18.

Latch 72 will remain in this state until node 76 is again taken to ground while the CS signal on line 92 is high. Thus, during normal operation, control of node 76 will be by $V_{cc}$ pad 18. However, it may be desirable to ensure that latch 72 will not ever be permitted to switch states. This may be accomplished in the embodiment of FIG. 5 by blowing a fuse 111 in fuse latch 74. This can be done by a laser if it is a polysilicon fuse.

During testing, fuse 111 is intact and holds a line 108 to approximately ground potential. This keeps a transistor 110 turned off which would otherwise prevent node 88 from reaching a high potential. The low potential on line 108 keeps transistor 84 turned on which likewise allows node 88 to assume a high potential depending upon whether transistors 82 and 106 are turned on. During this time, a p-channel transistor 112 of fuse latch 74 is turned on and transistors 116 and 114 of fuse latch 74 are turned off. Once the testing of the array has been completed, and it is desirable to remove latch 72 electrically from the circuit so that control of node 76 is never again returned to pad 20, fuse 111 may be eliminated from the circuit.

When fuse 111 is blown, the potential on line 108 is no longer held at ground potential. As the potential on line 108 rises, transistor 112 will turn off and transistor 114 will turn on, thus providing a path to ground for the gate of transistor 116 which will then turn on. Once transistor 116 turns on, the potential on line 108 goes permanently high. When the potential on line 108 goes high, transistor 84 turns off which electrically removes the path from $V_{cc}$ to node 88 through transistors 82 and 106. Similarly, transistor 110 turns on which then provides a ground path for node 88. Thus, once fuse 111 is removed from the circuit, node 88 goes permanently to approximately ground potential which keeps transistor 71 permanently on, thus supplying a permanently low resistance path from pad 18 to node 76.

The invention has been described above in a number of preferred embodiments, each of which uses an extra pad 20 to supply the varying voltage signal to the address word lines of the array. Some embodiments of the present invention may provide the varying voltage waveform directly to the $V_{cc}$ pad with appropriate control logic to provide for the necessary function of the invention. This may be desirable in situations where space on the chip is at an absolute premium and a further access pad is not desired.

It may also be desired to provide for even more sensitive testing of the cells in the memory array. This may be provided by raising the substrate bias voltage when N channel cells are being tested. It has been found that during testing under these conditions with a substrate bias of approximately ground potential (compared to the normal negative three volt potential for the substrate) that soft N-channel cells are more susceptible to flipping during the process of the present invention. That is, these cells will flip more easily and be more readily identified during the testing described above.

The illustrated embodiments all contain control circuitry. This is used so that the word line (or some other means to couple a test signal to memory cells) can be accessed during testing, and so that after testing, the memory will be secure from voltages being supplied improperly to the word line. One alternative to control circuitry is to arrange the memory so that for testing, the row decoder voltage or word line voltage can be controlled independently of other memory portions which are usually coupled to $V_{cc}$. Thus, two external pads could be used, one pad for $V_{cc}$ and the other pad for the test signal. After successful testing, the two pads could be bonded, thus ensuring that the row decoders will be connected to $V_{cc}$. Other arrangements may be devised to force the word line, or some equivalent, to an effective voltage other than 0 or $V_{cc}$ during testing; or to apply signals independently to the cells, one signal being $V_{cc}$ and the other being a test signal.

Although the present invention has been described for use with a varying voltage such a sawtooth waveform, one may utilize the present invention to identify soft cells in a particular memory cell array by supplying the word lines with a specific voltage, for example, 2.57 volts. Such a determination would have to be made on an empirical basis if it were found that most of the cells in the array which exhibit "soft" characteristics flip logic states at approximately this voltage. The advantage of the present invention as described in the preferred embodiments above is that soft cells, regardless of the voltage level at which they flip states, will still be detected.

It would also be possible to utilize the process of the present invention by supplying a series of discrete voltages to the word lines of the cells to be tested. For example, voltage steps of approximately 0.1 volt each enduring for several microseconds may suffice to identify nearly all of the soft cells in a memory array when that voltage signal was applied to the word lines of the cells as described above. It will be appreciated that this is merely an approximation of the ramping, sawtooth voltage waveform used in the preferred embodiment of the present invention.

What is claimed is:

1. In a memory cell array utilizing a power supply voltage (VCC), and having word lines for enabling the cells in a row of said array, a method for locating a potentially defective cell including the steps of:
   coupling a probe tester to a VCC pad and a test pad which is coupled to the word line for said cell;
   operating a control circuit to isolate the word line for said cell from said VCC pad but not from said test pad;
   storing a first predetermined value in said memory cell;
   applying a varying signal to said word line for said cell;
   determining whether said first predetermined value is still stored in said cell; and
   operating said control circuit to couple said word lines to said VCC pad.

2. The method of claim 1 wherein said step of applying a varying signal comprises applying a sawtooth voltage waveform having relatively slow rise and fall times.

3. The method of claim 2 wherein said sawtooth voltage waveform varies from about zero volts to about VCC and has a rise time of about five hundred microseconds and a fall time of about one thousand microseconds.

4. The method of claim 1 further including, after said determining step and prior to said operating step:
   storing a second predetermined value in said memory cell;
   applying said varying signal to the word line for said cell; and
   determining whether said second predetermined value is still stored in said cell.

5. The method of claim 4 further including indicating that said cell is potentially defective in response to a determination that said cell cannot maintain said first or second predetermined value after the application of said varying signal.

6. The method of claim 4 wherein said second predetermined value is the logical complement of said first predetermined value.

7. The method of claim 4 wherein said varying signal comprises a sawtooth voltage waveform having relatively slow rise and fall times.

8. The method of claim 7 wherein said sawtooth voltage waveform varies from about zero volts to about VCC and has a rise time of about five hundred microseconds and a fall time of about one thousand microseconds.

9. In a memory with an array of memory cells and including means for applying a VCC supply voltage to the memory for powering it, the improvement comprising:

a test pad accessible to a probe tester;
a VCC pad;
an access line for a memory cell;
means coupling said VCC pad and said test pad to said access line; and
means for selecting the pad which can control said access line.

10. The improvement of claim 9 wherein said test pad is accessible to a probe tester only prior to packaging.

11. The improvement of claim 9 wherein said means for selecting includes a gated transistor whose source-drain path couples the $V_{cc}$ pad to the test pad and a control circuit coupled to the gate of said transistor.

12. The improvement of claim 11 wherein said gated transistor in a first state couples the $V_{cc}$ pad to said access line and in a second state isolates said $V_{cc}$ pad from said access line, thereby permitting whatever signal is applied to said test pad to be coupled to said access line.

13. The improvement of claim 12 wherein said control circuit includes a $V_{bb}$ pad accessible to a probe tester.

14. The improvement of claim 12 wherein said control circuit includes a latch selectively operable between two states and means for operating said latch.

15. The improvement of claim 14 further including a fuse circuit coupled to said latch for permitting said latch to be operable when said fuse is in a first condition, and locking said latch into a second state when said fuse is in the other condition.

16. The improvement of claim 14 wherein said latch includes means responsively coupled to said test pad, said means being coupled to control said gated transistor, whereby a particular voltage applied to said test pad will cause said gated transistor to isolate said VCC pad from said access line.

17. The circuit according to claim 16 wherein said means responsive includes a P-channel transistor and an n-channel transistor whose source-drain paths are coupled in series and comprise at least part of a path between VCC and ground, including a node between said P-channel and n-channel transistors, said node being coupled to the gate electrode of said gated transistor, the gate electrodes of P-channel transistor and said n-channel transistor both being coupled to said test pad.

18. The improvement of claim 17 further including a fuse latch and a further transistor whose source-drain path is also in said path between VCC and ground, the gate electrode of said last-named transistor being responsively coupled to said fuse circuit.

19. The improvement according to claim 18 wherein said gated transistor comprises a P-channel transistor whose source-drain path is coupled between said VCC pad and said test pad in parallel with a resistor, the gate of said P-channel transistor being coupled electrically to said first node.

* * * * *